(12) United States Patent
Lim (10) Patent No.: US 12,401,190 B2
(45) Date of Patent: Aug. 26, 2025

(54) SEMICONDUCTOR DEVICE WITH PROTECTION CIRCUIT

(71) Applicant: ELECTRONIC DEVICE SOLUTION INC., Daejeon (KR)

(72) Inventor: Byeong Ok Lim, Daejeon (KR)

(73) Assignee: ELECTRONIC DEVICE SOLUTION INC., Daejeon (KR)

( * ) Notice: Subject to any disclaimer, the term of this patent is extended or adjusted under 35 U.S.C. 154(b) by 147 days.

(21) Appl. No.: 18/383,013

(22) Filed: Oct. 23, 2023

(65) Prior Publication Data

US 2025/0118960 A1    Apr. 10, 2025

(30) Foreign Application Priority Data

Oct. 5, 2023  (KR) .......................... 10-2023-0132629

(51) Int. Cl.
| | | |
|---|---|---|
| H02H 9/00 | (2006.01) | |
| H02H 9/02 | (2006.01) | |
| H02H 9/04 | (2006.01) | |

(52) U.S. Cl.
CPC .............. H02H 9/045 (2013.01); H02H 9/02 (2013.01)

(58) Field of Classification Search
None
See application file for complete search history.

(56) References Cited

U.S. PATENT DOCUMENTS

| | | | | |
|---|---|---|---|---|
| 8,599,527 | B2* | 12/2013 | Liu ........................ | H02H 3/202 361/111 |
| 2012/0223591 | A1* | 9/2012 | Cheon ..................... | H02J 50/70 307/104 |
| 2016/0164273 | A1* | 6/2016 | Tseng ...................... | H02H 3/20 361/18 |
| 2018/0206301 | A1* | 7/2018 | Wang ....................... | H02H 7/20 |
| 2024/0223138 | A1* | 7/2024 | Hong ................... | H04B 1/0466 |

FOREIGN PATENT DOCUMENTS

| | | |
|---|---|---|
| JP | 2012-249136 | 12/2012 |
| JP | 2019-176452 | 10/2019 |
| KR | 10-1860012 | 5/2018 |
| KR | 10-2213195 | 2/2021 |
| KR | 10-2021-0157025 | 12/2021 |
| KR | 10-2022-0015764 | 2/2022 |
| KR | 10-2022-0117069 | 8/2022 |

\* cited by examiner

*Primary Examiner* — Stephen W Jackson
(74) *Attorney, Agent, or Firm* — PnK IP LLC

(57) ABSTRACT

Proposed is a semiconductor device with a protection circuit that measures signal intensity and is able to prevent the occurrence of element failure due to a reflection signal or an overvoltage signal by performing adjustment of a signal path and adjustment of the signal intensity on the basis of measured signal intensity, wherein the semiconductor device includes an output signal processing terminal, an input signal processing terminal, and a wireless output-input terminal, a signal detection unit connected to the wireless output-input terminal, a first switch connected to the signal detection unit, a first resistive termination unit and a signal connection line each connected to the first switch so that the signal is able to be transferred by operation of the first switch, and a controller configured to control the first switch on the basis of the intensity of the signal.

7 Claims, 9 Drawing Sheets

SEMICONDUCTOR DEVICE WITH PROTECTION CIRCUIT

CROSS REFERENCE TO RELATED APPLICATION

This application claims priority from and the benefit of Korean Patent Application No. 10-2023-0132629, filed on Oct. 5, 2023, which is hereby incorporated by reference for all purposes as if fully set forth herein.

BACKGROUND

Field

The present disclosure relates to a semiconductor device with a protection circuit. More specifically, the present disclosure relates to a semiconductor device with a protection circuit, the protection circuit being configured to measure signal intensity and to prevent the occurrence of element failure due to a reflection signal or an overvoltage signal by performing adjustment of a signal path and adjustment of the signal intensity on the basis of measured signal intensity.

Discussion of the Background

A system that outputs and inputs wireless signals, such as a radar system or communication system, basically includes many types of semiconductor elements, and semiconductor devices such as output-input modules are provided through a combination of such semiconductor elements.

Such a semiconductor device for wireless output-input uses a duplicated RF signal path for output or input of RF signals and performs a change of the path of the RF signal and the real-time status detection, real-time control, and the like of the semiconductor device by including a separate duplicated control device.

Figure 1:
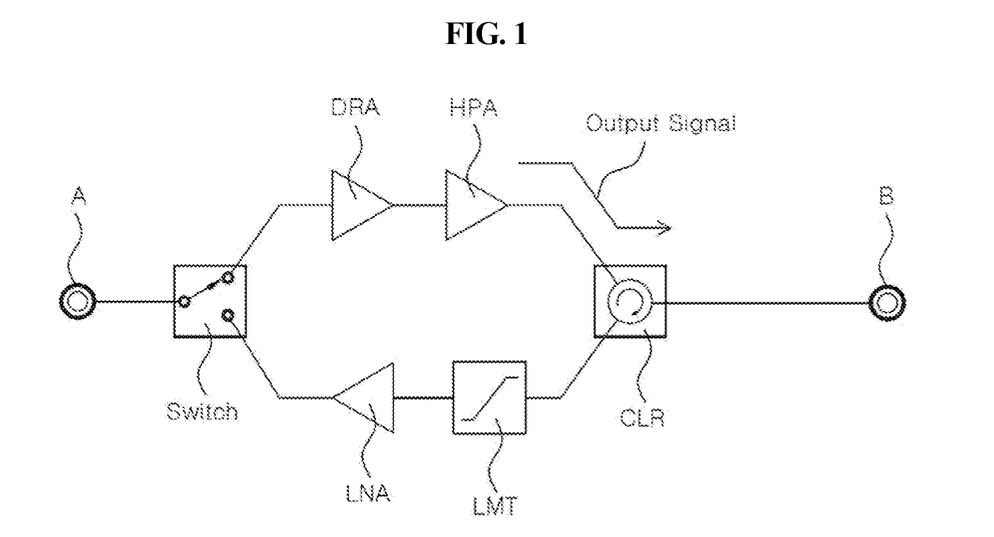
FIGS. 1 to 3 are configuration diagrams of conventional semiconductor devices, respectively.
Figure 2:
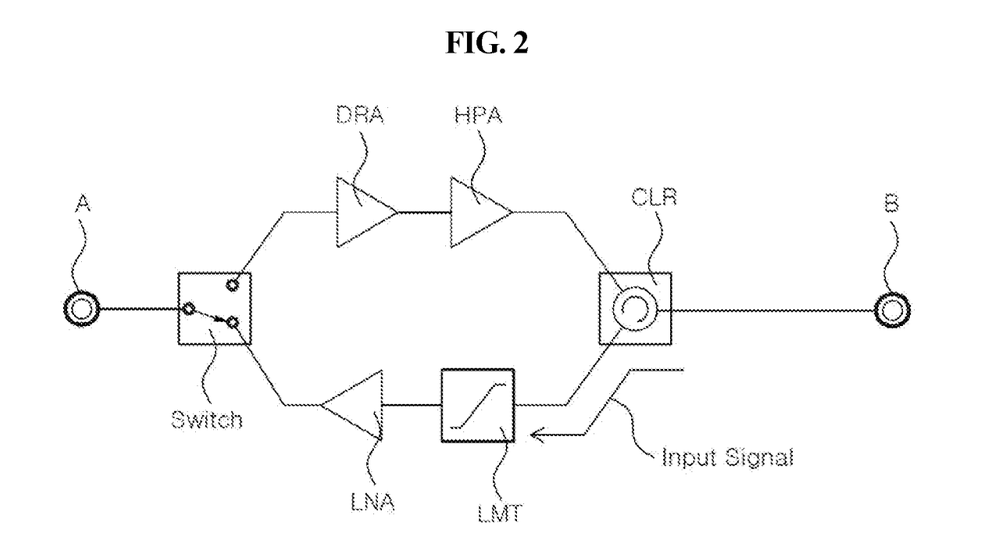
Figure 3:
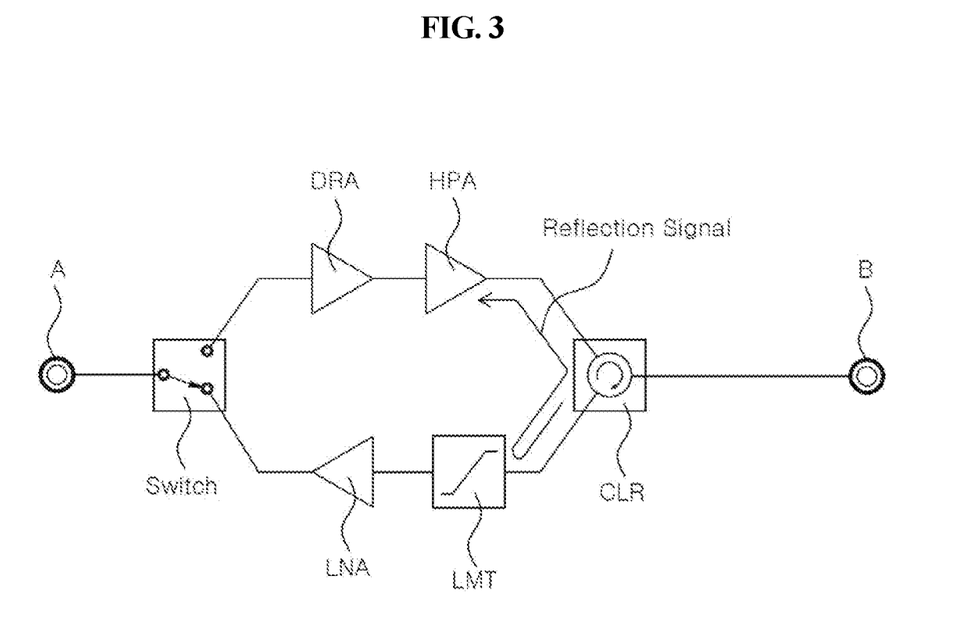

FIGS. 1 to 3 are each an example of conventional semiconductor devices for wireless output-input and may include: a hardware output-input terminal A connected to a data processing device and the like such as an FPGA; a switch; a driving amplifier (DRA); a high-power amplifier (HPA); a limiter (LMT); a low noise amplifier (LNA); a circulator (CLR); and a wireless output-input terminal B.

The wireless output-input terminal B may have an antenna (ANT) for output-input wireless signals connected thereto, and although not shown, the hardware output-input terminal A may include a controller or a corechip for controlling an output signal path and an input signal path.

Such a semiconductor device for wireless output-input may select the output signal path and the input signal path by controlling the switch and the circulator (CLR) through a control circuit depending on whether the signal is output or input.

Here, as shown in FIG. 1, the output signal path refers to the path that an output signal sequentially passes through the switch, the driving amplifier (DRA), the high power amplifier (HPA), and the circulator (CLR) from the hardware output-input terminal A and is transferred to the wireless output-input terminal B. As shown in FIG. 2, an input signal path refers to the path that an input signal sequentially passes through the circulator (CLR), the limiter (LMT), the low noise amplifier (LNA), and the switch from the wireless output-input terminal B and is transferred to the hardware output-input terminal A. These path definitions apply the same to claims of the semiconductor device with a protection circuit according to the present disclosure and the entire description of the invention.

However, in the process of outputting an output signal, due to a mismatch between the semiconductor device and the antenna, a short circuit between the antenna and the input terminal, or antenna not installed, or signal reflection due to various reasons at close range, and the like, the conventional semiconductor device has a problem in that the output signal is reflected or input from the wireless output-input terminal, and the reflection signal may conversely flow into the circuit or element inside the semiconductor device.

At this time, the circulator included in the conventional semiconductor device prevented the reflection signal from entering the internal element, especially the high-power amplifier. Specifically, the circulator is an element configured to output a signal input to one terminal to a terminal right next thereto and is a passive non-reciprocal element consisting of three terminals in a circular structure that allows signals to be transferred only in a forward direction and not to be transferred in a reverse direction.

Therefore, when a reflection signal is generated and input into the circulator for any reason, the reflection signal may not be transferred to the high-power amplifier located in the output signal path but may be transferred only to the input signal path, preventing the reflection signal from flowing into the high-power amplifier.

In other words, the reflection signal flowing into the input signal path by the circulator is transferred to the limiter, and the limiter reduces the intensity of the reflection signal to below the set voltage when it is above the limiter's limit level, so failure or damage to internal elements of the semiconductor device due to the incoming reflection signal may be prevented to some extent.

However, there is a limitation in a manner to limit the intensity of the reflection signal using this limiter. Meanwhile, when the limit on the characteristics of the limiter is exceeded, as shown in FIG. 3, the exceeded reflection signal may be reflected back from the limiter and flow into the circulator.

In such a case, depending on the characteristics of the circulator, the excessive reflection signal flows into the high-power amplifier (HPA), which is the terminal right next to the circulator, and a problem may arise in that the reflection signal damages the high-power amplifier.

Therefore, a circuit configuration in such a manner is not effective in preventing damage or failure of the high-power amplifier, and the circulator applied to the circuit configuration for wireless output-input is bulky, heavy, and expensive, so there is a problem in that the circulator may not fit a recent trend of miniaturization and weight reduction.

The above information disclosed in this Background section is only for understanding of the background of the inventive concepts, and, therefore, it may contain information that does not constitute prior art.

SUMMARY

Accordingly, the present disclosure has been made keeping in mind the above problems occurring in the related art, and the present disclosure is intended to provide a semiconductor device with a protection circuit, the protection circuit being configured to measure signal intensity and to prevent the occurrence of element failure due to a reflection signal or an overvoltage signal by performing adjustment of a signal path and adjustment of the signal intensity on the basis of measured signal intensity.

Additional features of the inventive concepts will be set forth in the description which follows, and in part will be apparent from the description, or may be learned by practice of the inventive concepts.

According to one aspect of the invention, a semiconductor device with a protection circuit, the semiconductor device includes: an output signal processing terminal, an input signal processing terminal, and a wireless output-input terminal; a signal detection unit connected to the wireless output-input terminal and configured to detect intensity of a signal transferred from the wireless output-input terminal toward the input signal processing terminal; a first switch connected to the signal detection unit and configured to operate on the basis of the intensity of the signal detected by the signal detection unit; a first resistive termination unit and a signal connection line each connected to the first switch so that the signal is able to be transferred by operation of the first switch, and disposed logically in parallel with each other, whereby the signal is able to be alternatively transferred to either one thereof, and a controller configured to control the first switch on the basis of the intensity of the signal detected by the signal detection unit, wherein the controller operates the first switch so that the signal is transferred to the signal connection line when the intensity of the signal detected by the signal detection unit is within a preset value and operates the first switch so that the signal is transferred to the first resistive termination unit when the intensity of the signal detected by the signal detection unit exceeds the preset value.

The semiconductor device with a protection circuit may further include a second switch connected to an end opposite to the one end of the signal connection line to which the first switch is connected, wherein the controller, when outputting or inputting the signal, may control the first switch so that the signal is transferred through the signal connection line, and when outputting the signal, may operate the second switch so that the signal is able to be output by allowing the output signal processing terminal and the signal connection line to be connected, and when inputting the signal, may operate the second switch so that the signal is able to be output by allowing the input signal processing terminal and the signal connection line to be connected.

The semiconductor device with a protection circuit may further include a second resistive termination unit disposed logically in parallel with the output signal processing terminal and the input signal processing terminal, thereby being configured to be able to be electrically connected to the signal connection line by the second switch, wherein the controller may allow the second switch to be connected to the input signal processing terminal when the intensity of the signal detected by the signal detection unit is within a preset value and may allow the second switch to be connected to the second resistive terminal unit when the intensity of the signal detected by the signal detection unit exceeds the preset value.

The semiconductor device with a protection circuit may further include an electrical branch point provided between the first switch and the signal detection unit; and a switch protection unit disposed in parallel with the first switch so that the signal is able to be output thereto by being separated at the branch point, wherein the signal to be transferred from the signal detection unit to the first switch may be branched off at the branch point and input to the switch protection unit, and the switch protection unit may be configured to provide an impedance value that varies depending on the intensity of the input signal, whereby the intensity of the signal transferred to the first switch may be adjusted.

The switch protection unit may include: a corresponding voltage generator configured to receive the intensity of the signal detected by the signal detection unit and to generate a corresponding voltage corresponding to the intensity of the signal; and an impedance-varying unit configured to provide an impedance value that varies depending on the corresponding voltage.

The impedance-varying unit may include: at least one transistor having one end connected to the branch point; and an impedance element connected between the at least one transistor and grounding, wherein the at least one transistor may have an impedance value that varies depending on the corresponding voltage.

The impedance-varying unit may further include a voltage limiter connected between the branch point and the at least one transistor.

As described above, the semiconductor device according to the present disclosure measures signal intensity and is able to prevent device failure due to a reflection signal or an overvoltage signal by performing adjustment of a signal path and adjustment of the signal intensity on the basis of measured signal intensity.

In addition, the effect of preventing device failure may be further increased by sequentially arranging resistive elements and adjusting the signal path.

In addition, by employing a switch protection unit, it is possible to prevent the failure of the switch itself due to the reflection signals or overvoltage signals.

In addition, the switch protection unit includes an impedance-varying unit to provide variable impedance, whereby signals are allowed to be transferred to the switch, but the switch failure may be prevented.

In addition, by employing a voltage limiter, the switch protection part is configured to protect the switch by increasing the impedance value to prevent current from substantially flowing thereinto when the voltage is low and decreasing the impedance value to allow current to flow thereinto when the voltage is high, thereby enabling power efficiency to be increased and waste of power to be prevented.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts

DETAILED DESCRIPTION

Features and effects of the present disclosure will become more apparent through the following detailed description related to accompanying drawings, and accordingly, those skilled in the art will be able to easily implement a technical idea of the present disclosure. The present disclosure may be subject to various changes and may have various forms. Therefore, specific embodiments will be illustrated in the drawings and described in detail in the text. However, this is not intended to limit the present disclosure to a specific disclosed form and should be understood to include all changes, equivalents, and substitutes included in the spirit and technical scope of the present disclosure. Terms used in the present application are only for describing specific embodiments and are not intended to limit the invention.

Hereinafter, structures, effects, and exemplary embodiments of the present disclosure will be described in detail with reference to the accompanying drawings.

Figure 4:
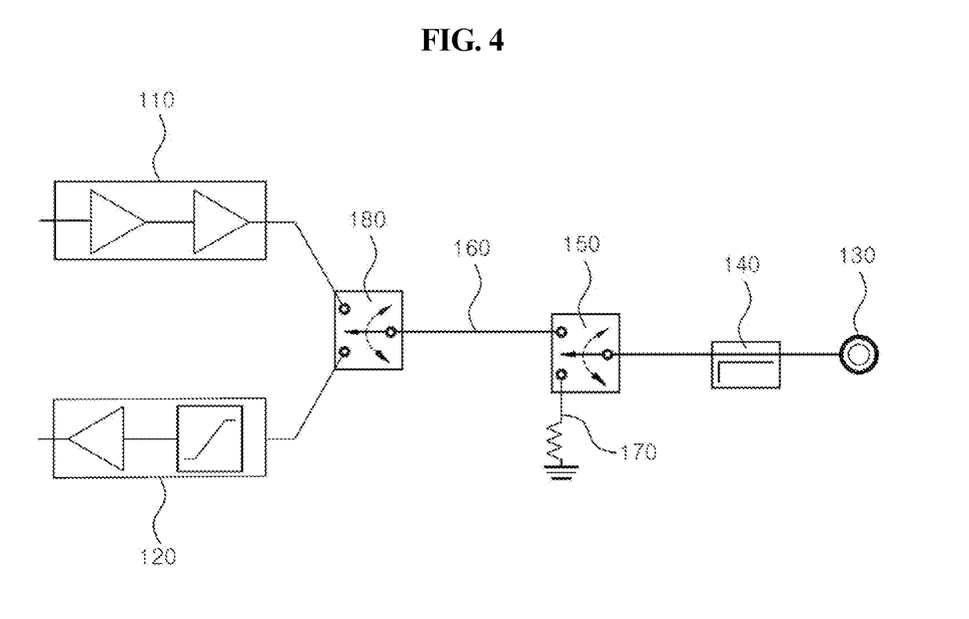
FIG. 4 is a configuration diagram of a semiconductor device with a protection circuit according to an embodiment of the present disclosure.
Figure 5:
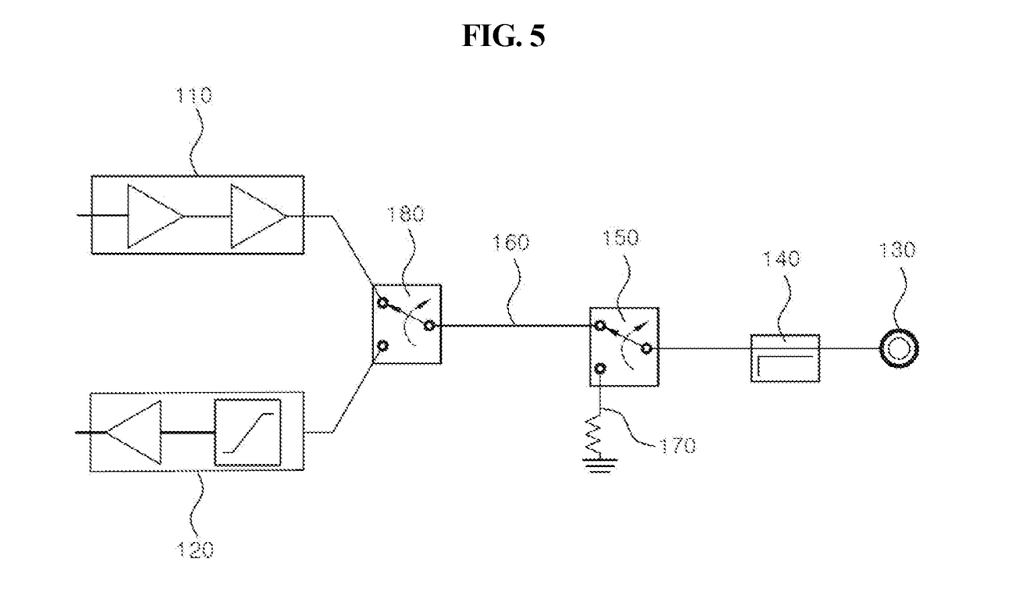
FIG. 5 is a configuration diagram of the semiconductor device with a protection circuit shown in FIG. 4 during output.
Figure 6:
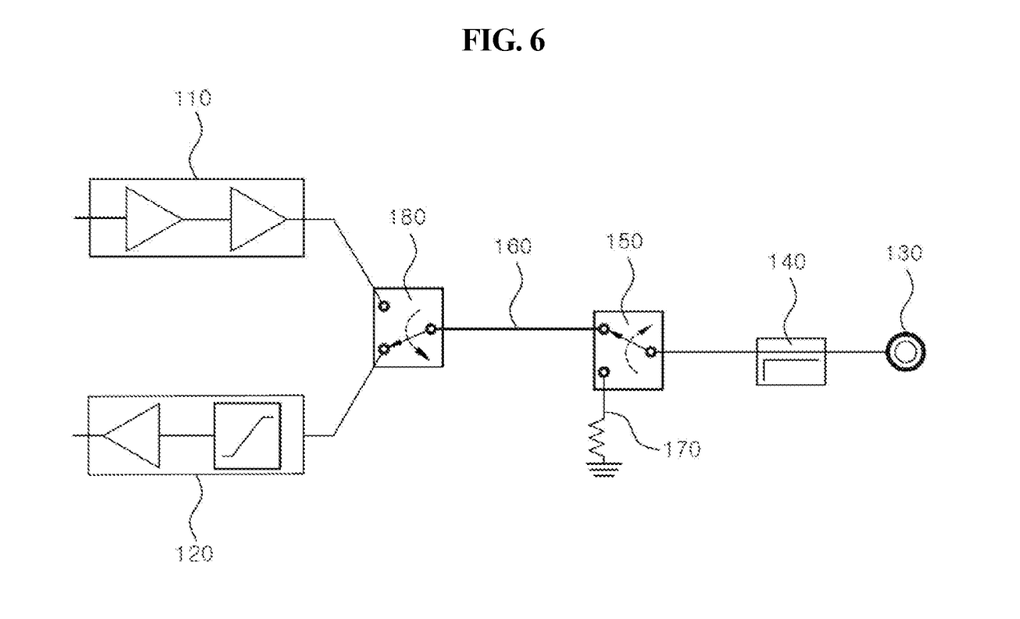
FIG. 6 is a configuration diagram of the semiconductor device with a protection circuit shown in FIG. 4 during input.
Figure 7:
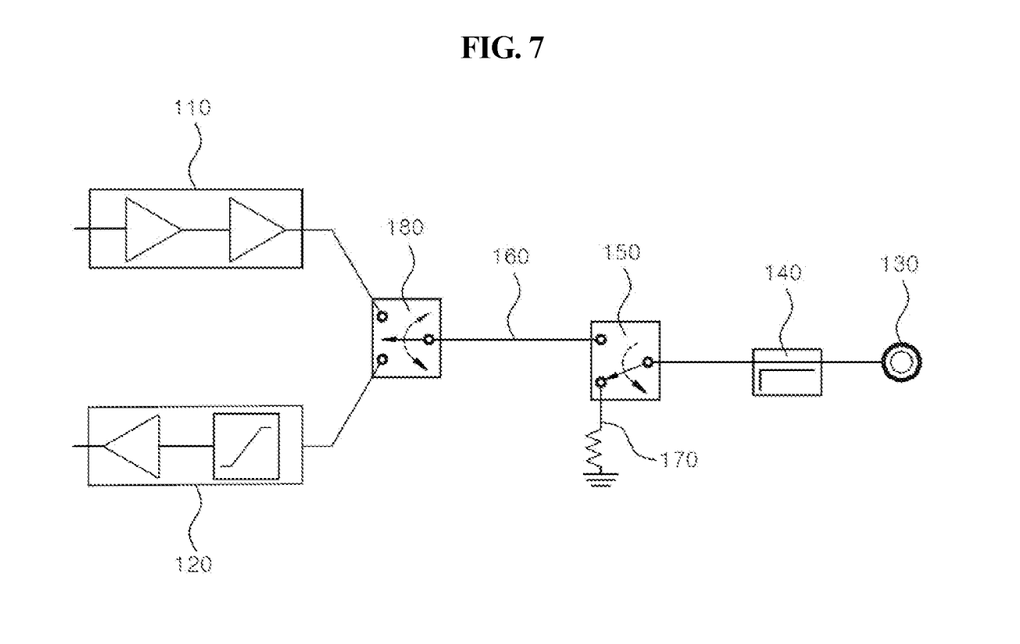
FIG. 7 is a configuration diagram showing an operation of a first switch in the semiconductor device with a protection circuit shown in FIG. 4 when a signal intensity detected by a signal detection unit exceeds a preset value.

FIG. 4 is a configuration diagram of a semiconductor device with a protection circuit according to an embodiment of the present disclosure. FIG. 5 is a configuration diagram of the semiconductor device with a protection circuit shown in FIG. 4 during output, FIG. 6 is a configuration diagram of the semiconductor device with a protection circuit shown in FIG. 4 during input, and FIG. 7 is a configuration diagram showing an operation of a first switch in the semiconductor device with a protection circuit shown in FIG. 4 when a signal intensity detected by a signal detection unit exceeds a preset value.

Figure 8:
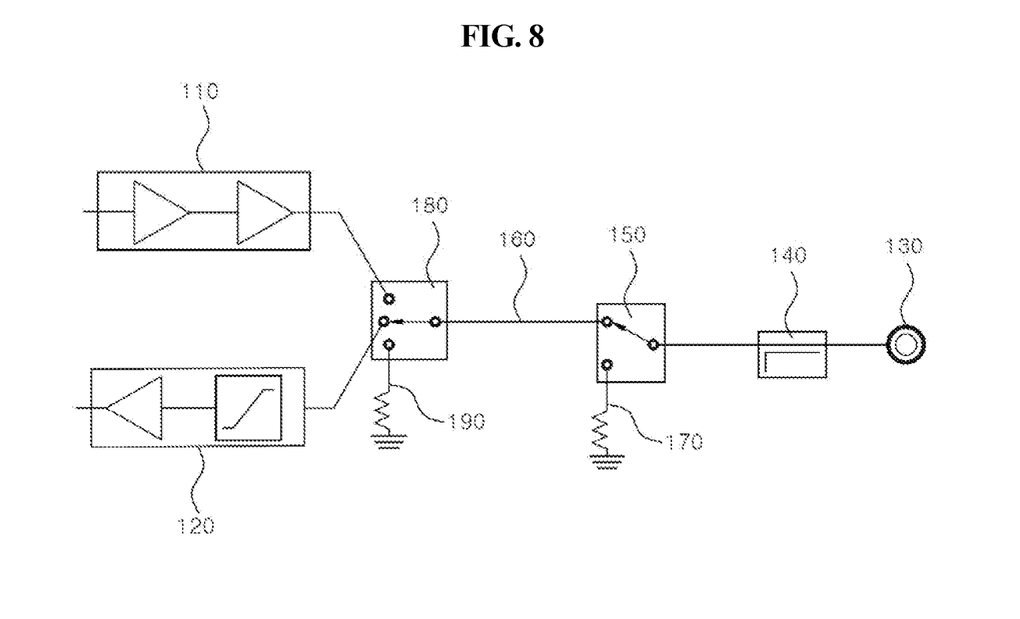
FIG. 8 is a configuration diagram showing another embodiment of a second switch in the semiconductor device with a protection circuit shown in FIG. 4.
Figure 9:
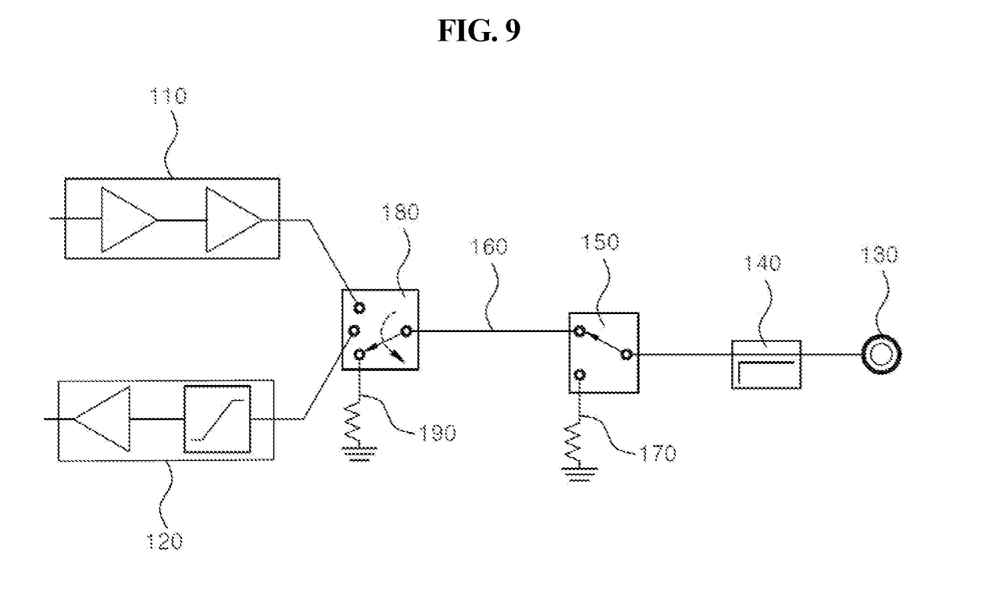
FIG. 9 is a configuration diagram showing an operation of the second switch when a signal intensity detected by the signal detection unit exceeds a preset value in the semiconductor device with a protection circuit shown in FIG. 8.
Figure 10:
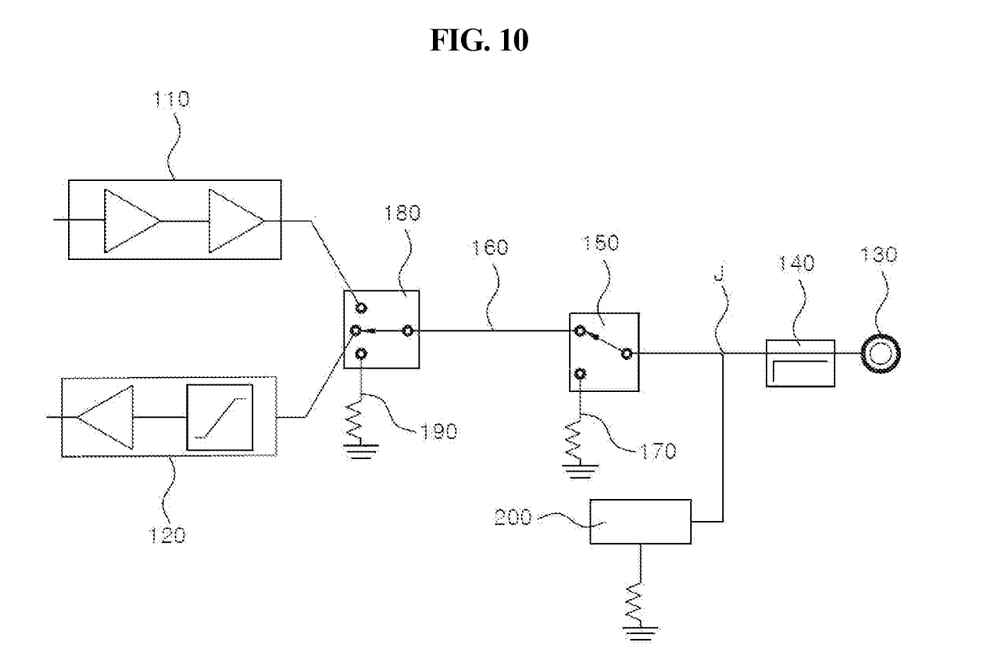
FIG. 10 is a configuration diagram of a switch protection unit employed in the semiconductor device with a protection circuit shown in FIG. 8.

Further, FIG. 8 is a configuration diagram showing another embodiment of a second switch in the semiconductor device with a protection circuit shown in FIG. 4, FIG. 9 is a configuration diagram showing an operation of the second switch when a signal intensity detected by the signal detection unit exceeds a preset value in the semiconductor device with a protection circuit shown in FIG. 8, and FIG. 10 is a configuration diagram of a switch protection unit employed in the semiconductor device with a protection circuit shown in FIG. 8.

As described above, the present disclosure relates to a semiconductor device with a protection circuit that is able to protect the circuit from reflection signals or overvoltage signals. To this end, the semiconductor device with a protection circuit according to an embodiment of the present disclosure includes, as shown in FIG. 4, an output signal processing terminal 110, an input signal processing terminal 120, a wireless output-input terminal 130, a signal detection unit 140, a first switch 150, a signal connection line 160, a first resistive termination unit 170, and a second switch 180 and may further include, as shown in FIGS. 8 to 10, a second resistive termination unit 190, a branch point J, and a switch protection unit 200.

Here, the output signal processing terminal 110 is a configuration that processes a signal for outputting and may include a driving amplifier and a high-power amplifier connected to the hardware output-input terminal as described above but is not limited thereto.

Such an output signal processing terminal serves to modulate or amplify a signal generated from a mobile phone, a controller main body, MCU, FPGA, hardware, and the like so as to enable wireless communication and may be provided by combining various elements to this end.

The input signal processing terminal 120 is a configuration that processes an input signal and may include a limiter, a low noise amplifier, and the like as described above but is not limited thereto.

Such an input signal processing terminal 120 also serves to demodulate, remove noise, or amplify a signal input as a wireless signal so that the signal may be used in a mobile phone, a controller main body, MCU, FPGA, hardware, and the like and may be provided by combining various elements to this end.

The wireless output-input terminal 130 is a configuration that outputs and inputs a wireless signal and may be connected to an antenna (not shown). Even though other components not mentioned may be included between the wireless output-input terminal 130 and the antenna, the wireless output-input terminal 130 is arranged to be closest to the antenna in the semiconductor device with a protection circuit according to the embodiment of the present disclosure and is provided to be able to output to and input from the antenna therethrough.

The wireless signal input through the antenna is transferred to this wireless output-input terminal 130, and this wireless output-input terminal 130 transfers the signal toward the input signal processing terminal 120.

The signal detection unit 140 is connected to the wireless output-input terminal 130 and detects the intensity of the signal transferred from the wireless output-input terminal 130 toward the input signal processing terminal 120.

Here, the signal transferred toward the input signal processing terminal 120 may be a normal signal input through the antenna under common circumstances but may also be a reflection signal or an abnormal signal.

Here, the abnormal signal refers to an abnormal signal such as a signal having a momentarily high voltage through the antenna.

On the other hand, when a signal is output from a semiconductor device such as the present disclosure, the reflection signal refers to a signal that an output signal is unable to be output to the outside and is reflected and returned due to a mismatch with the antenna, a short circuit between the wireless output-input terminal 130 and the antenna, or a nonmounted antenna. In other words, the reflection signal refers to a signal that proceeds from the wireless out-input terminal 130 in an input direction that is an opposite direction to the direction of an output signal and returns from the wireless output-input terminal 130 toward the first switch 150.

The signal detection unit 140 detects the intensity of the signal output from the wireless output-input terminal 130 toward the first switch 150, regardless of its type. To this end, the signal detection unit 140 may include a coupler that is an RF passive element, which distributes or combines signal power, but is not limited thereto, The intensity of the signal detected by the signal detection unit 140 is transferred to the controller (not shown), and the controller operates the first switch 150, and the second switch 180 on the basis of the intensity of the reflection signal, and this will be described later.

The first switch 150 is electrically connected to the signal detection unit 140 and operates on the basis of the intensity of the signal detected by the signal detection unit 140.

Strictly speaking, as described above, the intensity of the signal detected by the signal detection unit 140 is transferred to the controller, and the controller, on the basis of this, determines for the first switch 150 to transfer the signal toward which element out of the first resistive termination unit 170 or the connection line 160, and operates the first switch 150.

The signal connection line 160 and the first resistive termination unit 170 are electrically connected to the first switch 150 so as to allow the signal to be alternatively transferred by operation of the first switch 150.

The signal connection line 160 and the first resistive termination unit 170 are disposed logically in parallel, and the first switch 150 is provided to be able to transfer the signal to either the signal connection line 160 or the first resistive termination unit 170 by the controller.

Here, when the first switch 150 is operated to transfer the signal to the signal connection line 160, the signal connection line 160 transfers a signal that is transferred from the first switch 150 connected to one side to the second switch 180 connected to an opposite side.

Meanwhile, when the first switch 150 is operated such that a signal is to be transferred to the first resistive termination 170, the first resistive termination 170 may perform a function of absorbing and quenching the signal transferred through the first switch 150, and as an example, the first resistive termination 170 may be grounding.

The second switch 180 is connected to an end opposite to the one end of the signal connection line 160 to which the first switch 150 is connected, that is, to the opposite side.

The second switch 180 is also operated by the controller. When it is desired to output a signal, as shown in FIG. 5, the controller controls the first switch 150 so that the signal is able to be transferred through the signal connection line 160 and, at the same time, operates the second switch 180 so that the signal is able to be output by connecting the output signal processing terminal 110 and the signal connection line 160.

Meanwhile, when it is desired to have an input signal, as shown in FIG. 6, the controller controls the first switch 150 so that the signal is able to be transferred through the signal connection line 160 and, at the same time, operates the second switch 180 so that the signal is able to be output by connecting the input signal processing terminal 120 and the signal connection line 160.

On the basis of such a configuration, a first embodiment of an algorithm in which the controller protects the semiconductor device with a protection circuit according to the present disclosure will now first be described.

When the intensity of the signal detected by the above-described signal detection unit 140 is within a preset value, as shown in FIG. 7, the controller operates the first switch 150 so that the signal transferred from the wireless output-input terminal 130 is transferred to the signal connection line 160.

In other words, when the intensity of the signal detected by the signal detection unit 140 is a voltage or current value to some extent not damaging the elements, the controller judges the value to be a normal signal and controls the first switch 150 so that the signal passes through the normal input signal path.

Meanwhile, when the intensity of the signal detected by the signal detection unit 140 exceeds a preset value, the controller operates the first switch 150 so that the signal is transferred to the first resistive termination unit 170.

In other words, when the intensity of the signal detected by the signal detection unit 140 is a voltage or current value to some extent causing damage to the elements (a case of exceeding a preset value), the controller judges the value to be an abnormal signal or a reflection signal, prevents the signal from passing through the input signal path, and simultaneously transfers this signal to the first resistive termination unit 170, thereby absorbing and quenching the signal of excessive intensity.

With this algorithm, the semiconductor device with a protection circuit according to the present disclosure may prevent damage to the high-power amplifier and the like in the input signal processing terminal 120 due to reflected signals.

Meanwhile, a second embodiment of an algorithm in which the controller protects the semiconductor device with a protection circuit according to the present disclosure will be described below.

As described above, the semiconductor device with a protection circuit according to the present disclosure has a second resistive termination unit 190, which is an additional path configuration that the second switch 180 may select.

As shown in FIG. 8, this second resistive termination unit 190 is electrically connected to the second switch 180 and is disposed logically in parallel with the output signal processing terminal 110 and the input signal processing terminal 120.

Like the first resistive termination unit 170, the second resistive termination unit 190 may perform a function of absorbing and quenching a signal transferred through the second switch 180, and as an example, the second resistive termination unit 190 may be grounding.

The signal transferred through the first switch 150 and the signal connection line 160 is configured to be transferred to one of the input signal processing terminal 120, the output signal processing terminal 110, or the second resistive terminal unit 190 depending on an operation of the second switch 180.

Here, the second embodiment of the algorithm for protecting the semiconductor device with a protection circuit according to the present disclosure is implemented, and it is specifically as follows.

When the intensity of the signal detected by the above-described signal detection unit 140 is within a preset value, as shown in FIG. 8, the controller operates the second switch 180 so that the signal transferred from the signal connection line 160 is transferred to the input signal processing unit 120.

In other words, when the intensity of the signal detected by the signal detection unit 140 is a voltage or current value to some extent not damaging the elements, the controller judges the value to be a normal signal and controls the second switch 180 so that the signal passes through the normal input signal path.

Meanwhile, when the intensity of the signal detected by the signal detection unit 140 exceeds the preset value, as shown in FIG. 9, the controller operates the second switch 180 so that the signal is transferred to the second resistive termination unit 190.

In other words, when the intensity of the signal detected by the signal detection unit 140 is a voltage or current value to some extent causing damage to the elements (a case of exceeding a preset value), the controller judges the value to be an abnormal signal or a reflection signal, prevents the signal from passing through the input signal path, and simultaneously transfers this signal to the second resistive termination unit 190, thereby absorbing and quenching the signal of excessive intensity.

With this algorithm, the semiconductor device with a protection circuit according to the present disclosure may prevent damage to the high-power amplifier and the like in the input signal processing terminal 120 due to reflected signals.

Here, speaking of the effect of this configuration, as previously discussed in the first embodiment, even the configuration of the first switch 150 and the first resistive termination unit 170 may prevent damage due to reflection signals to some extent.

However, a high-intensity signal may be transferred to the signal connection line 160 for a very short period of time due to an operation delay or breakdown of the first switch 150, and in such a case, the elements in the output signal processing terminal 110 may be damaged, so the protection circuit is configured in a double manner.

Therefore, for example, when a shielding rate of a signal of the intensity exceeding the preset value or a reflection signal, by the first switch 150 and the first resistive termination 170 is 90%, and a shielding rate of a signal of the intensity exceeding the preset value or a reflection signal, by the second switch 180 and the second resistive termination unit 190 is 90%, in the first embodiment, the probability of damage to the output signal processing terminal 110 due to the reflection signal and the like is 10%, but in the second embodiment, it is configured in the double manner, so the probability of damage to the output signal processing terminal 110 due to reflection signal and the like is 0.1× 0.1=0.01, that is, 1%. Therefore, substantially, it may be said that there is almost no possibility of damage to the output signal processing terminal 110 due to the reflection signal and the like.

Next, the semiconductor device with a protection circuit according to the present disclosure may further include a branch point J and a switch protection unit 200 in addition to the above configuration.

The branch point J is provided between the first switch 150 and the signal detection unit 140 and serves to electrically branch the signal. This branch point J may not be a physical element and may include a contact point provided to separate the signal on the path through which the signal is transferred.

As shown in FIG. 10, the switch protection unit 200 is provided so that a signal separated from the branch point J may be output thereto and, to this end, is disposed logically in parallel with the first switch 150.

Therefore, a signal transferred from the wireless output-input terminal 130 to the signal detection unit 140 is branched off at the branch point J, and part of it is transferred to the first switch 150 and the remainder is transferred to the switch protection unit 200.

The switch protection unit 200 is provided to protect the first switch 150, and taking into consideration the path of the reflection signal, the second switch 180 is located in series at the rear of the first switch 150, so when the first switch 150 is protected, the second switch 180 may also be protected naturally.

Before describing the configuration of the switch protection unit 200, characteristics of the first switch 150 and the second switch 180 used in the semiconductor device with a protection circuit according to the present disclosure will first be described.

RF switches such as the first switch 150 and the second switch 180 used in the semiconductor devices used for wireless output-input, such as the present disclosure, are elements commonly used in communication modules and serve to allow RF signals to be passed through or the RF signals to be bypassed to the ground (in the present disclosure, the first and second resistive termination units).

The RF switch is also used to change the frequency used at the antenna. At this time, the RF switch is connected between the antenna and the impedance element, thereby also serving switching of the connection of the impedance element and the antenna.

For these RF switches, it is very important to have the withstand voltage characteristics that may withstand high power of the RF signals. When the RF switch is in an off state, high voltage may be applied to the RF switch, thereby causing the RF switch to have linearity collapse and physical destruction occurrence.

The voltage that a switch in the off state may withstand is limited, so it is important to prevent the breakdown of the RF switch. In general, to prevent the breakdown of the RF switch, a method of connecting multiple transistors in series is widely used.

When multiple stages of transistors in series are used to configure an RF switch, the voltage distributed to one transistor is lowered, preventing the breakdown of the RF switch.

However, the breakdown of the RF switch occurs even when the voltage is distributed high to only one specific stage among several transistors, so a method of connecting more and more transistors in series is used to solve this problem. However, when too many transistors are connected in series in this method, there is a problem in that the characteristics of the switch in the on-state deteriorate.

Meanwhile, to compensate for this, a method of increasing the total width of the transistor is also used, but this method has a problem in that the size of an integrated circuit is excessively increased.

Therefore, in the present disclosure, it is configured such that the signal is branched off through a branch point J, and the first switch 150 and the switch protection unit 200 are disposed logically in parallel.

Therefore, when a signal of an intensity exceeding the preset value is transferred, that is, when a high voltage is applied, the first switch 150 is protected by preventing this high-intensity signal from being completely transferred directly to the first switch 150 by branching off at the branch point J.

Figure 11:
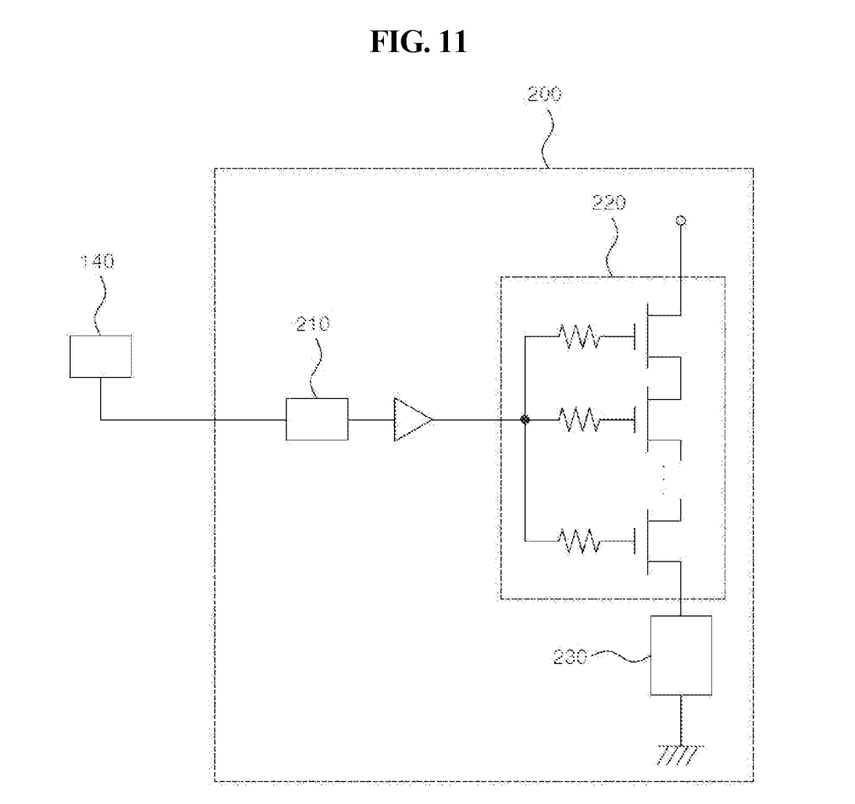
FIGS. 11 and 12 are diagrams of the switch protection unit of the semiconductor device with a protection circuit shown in FIG. 10.
Figure 12:
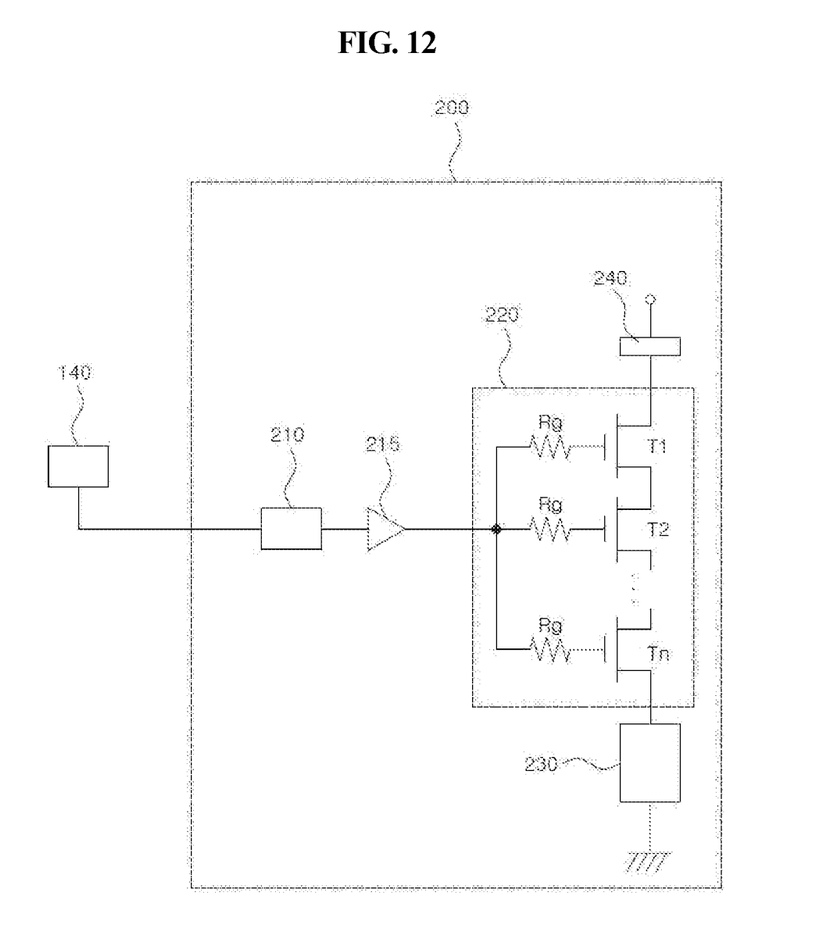

On the other hand, when a normal signal, that is, a signal of intensity within a preset value, is output, as will be described later, an impedance-varying unit 220 and a voltage limiter 240 are employed to allow the signal not to be substantially transferred to the switch protection unit 200, whereby signal input efficiency is prevented from deteriorating.

Hereinafter, the configuration of this switch protection unit 200 will be described in detail.

FIGS. 11 and 12 are diagrams of the switch protection unit of the semiconductor device with a protection circuit shown in FIG. 10.

As shown in FIG. 11, the switch protection unit 200 includes a corresponding voltage generator 210, a buffer 215, an impedance-varying unit 220, and an impedance element 230 and may further includes a voltage limiter 240.

The corresponding voltage generator 210 receives an intensity information signal of the signal detected by the signal detection unit 140 and generates a corresponding voltage corresponding to the intensity of the input signal.

The corresponding voltage generator 210 outputs the corresponding voltage generated to the buffer 215, and the buffer 215 drives the impedance-varying unit 220 according to the corresponding voltage.

The impedance-varying unit 220 varies the internal impedance value according to the output of the buffer 215, and therefore, looking logically, the impedance-varying unit 220 may be seen as providing an impedance value that varies according to the corresponding voltage.

Specifically, when the corresponding voltage increases (that is, rises), the impedance-varying unit 220 lowers the internal impedance value. Therefore, according to the voltage-current distribution law, most high-voltage signals (signals of intensity exceeding a preset value) flow toward the switch protection unit 200 of a low impedance value, thereby protecting the first switch 150.

Meanwhile, when the corresponding voltage decreases (that is, falls), the impedance-varying unit 220 increases the internal impedance value. Therefore, according to the voltage-current distribution law, normal signals (signals of intensity within the preset value) hardly flow toward the switch protection unit 200 of a high impedance value and are mostly transferred to the first switch 150, whereby the input efficiency of the signal may be prevented from deteriorating when the signal is normal.

As shown in FIG. 11, the impedance-varying unit 220 includes transistors T1 to Tn equal to or more than one connected in series. Here, in FIG. 11, the transistor is expressed as including a plurality of transistors, but it is not limited to this and may be configured to include only one transistor.

The output of the buffer 215 through a gate resistor Rg is input to each of a plurality of transistors T1 to Tn. In addition, a drain of the transistor T1 is connected to the branch point J, a drain of the transistor T2 is connected to the source of the transistor T1, and by the same logic, the drain of each transistor Tn is connected to the source of the transistor Tn−1. Meanwhile, the source of the transistor Tn is connected to the impedance element 230.

Each of these transistors (T1 to Tn) may be a Field Effect Transistor (FET), a Metal Oxide Semiconductor Field Effect Transistor (MOSFET), or a Bipolar Junction Transistor (BJT) but is not limited to this. In other words, transistors may be applied without limitation as long as they are elements that produce the same effect.

The impedance element 230 is provided between the impedance-varying unit 220 and grounding. That is, the impedance element 230 is connected between the source and grounding of the transistor Tn.

The impedance element 230 includes at least one of a resistor, a capacitor, and an inductor and provides a predetermined impedance value depending on the frequency of the RF signal.

Meanwhile, as shown in FIG. 12, the switch protection unit 200 may further include a voltage limiter 240 connected between the branch point J and the impedance-varying unit 220.

Figure 13:
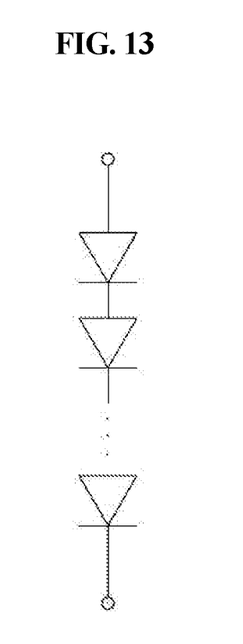
FIGS. 13 and 14 are diagrams of the configuration of a voltage limiter of the semiconductor device with a protection circuit shown in FIG. 12.

The voltage limiter 240 may be implemented through at least one diode. Meanwhile, the voltage limiter 240 may include a plurality of diodes connected to each other in series, as shown in FIG. 13. Here, in FIG. 13, it is composed of a plurality of diodes but is not limited to this and may naturally be implemented through a single diode.

Figure 14:
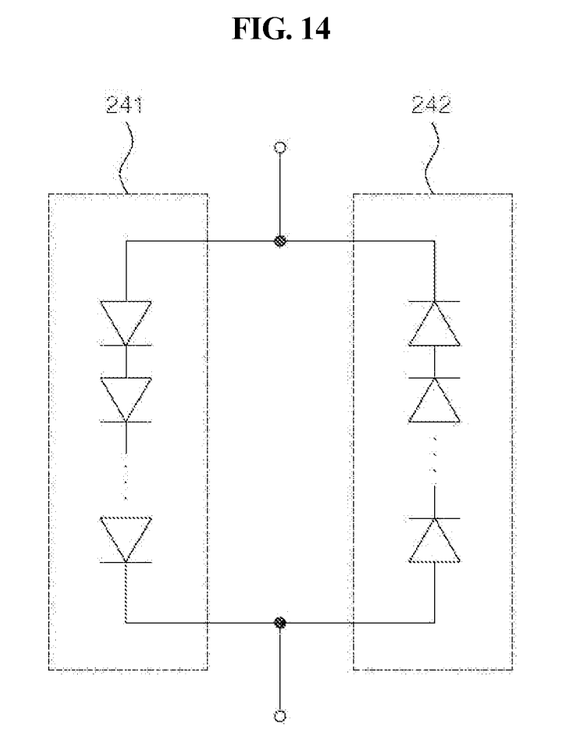

Meanwhile, the RF signal is alternating current, so the voltage limiter 240 may include a first diode 241 and a second diode 242 connected back to back, as shown in FIG. 14.

The first diode 241 may include a plurality of diodes connected in series with each other, and the second diode 242 has a direction opposite to the first diode 241 and may include a plurality of diodes connected in series with each other.

That is, the first diode 241 and the second diode 242 may be connected back to back. Therefore, when the RF signal is a positive (+) value, the first diode 241 may operate as a voltage limiter, and when the RF signal is a negative (−) value, the second diode 242 may operate as a voltage limiter.

FIGS. 13 and 14 are diagrams of the configuration of a voltage limiter of the semiconductor device with a protection circuit shown in FIG. 12.

Meanwhile, naturally, in FIGS. 13 and 14, the first diode 241 and the second diode 242 are expressed as including a plurality of diodes, but they can be implemented with only one diode.

The voltage limiter 240 is connected between the branch point J and the impedance-varying unit 220, whereby the efficiency of the switch protection unit 200 according to the present disclosure may be increased.

To explain this, due to the nature of the voltage limiter 240, when a threshold voltage or higher is applied to opposite ends, a predetermined limiter voltage is applied to the opposite ends as the voltage limiter 240 is turned on.

That is, the voltage limiter 240 has a low impedance value at no less than the threshold voltage. Meanwhile, according to the same principle, the voltage limiter 240 turns off at less than the threshold voltage and has a high impedance value.

Substituting this into the operation of the switch protection unit 200 according to the present disclosure, when a signal of an intensity exceeding a preset value is transferred, the voltage limiter 240 is turned on, so that the voltage limiter 240 has a low impedance value. As a result, according to the voltage-current distribution law, most high-voltage signals (signals of the intensity exceeding the preset value) become to flow toward the switch protection unit 200 of a low impedance value, thereby protecting the first switch 150.

On the other hand, when a signal of intensity within the preset value is transferred, the voltage limiter 240 is turned off, so that the voltage limiter 240 has a high impedance value. According to the voltage-current distribution law, normal signals (signals of intensity within the preset value) hardly flow toward the switch protection unit 200 of a high impedance value and are mostly transferred to the first switch 150, whereby the input efficiency of the signal may be prevented from deteriorating when the signal is normal.

The embodiments of the present disclosure have been described above, and due to the above configuration, the semiconductor device with a protection circuit according to the present disclosure may not only protect the internal configuration including the input signal processing terminal 120 but also protect the first switch 150 and the second switch 180 from reflection signals and the like.

The semiconductor device with a protection circuit according to the embodiment of the present disclosure has been described above, and the user may measure the intensity of the signal by employing the semiconductor device with a protection circuit according to the present disclosure and perform signal path adjustment and signal intensity adjustment on the basis of the measured intensity, whereby a device failure due to reflection signals or overvoltage signals may be prevented.

In addition, the effect of preventing device failure may be further increased by sequentially arranging resistive elements and adjusting the signal path.

In addition, by employing a switch protection unit, it is possible to prevent the failure of the switch itself due to the reflection signals or overvoltage signals.

In addition, the switch protection unit includes an impedance-varying unit to provide variable impedance, whereby signals are allowed to be transferred to the switch, but the switch failure may be prevented.

In addition, by employing a voltage limiter, the switch protection part is configured to protect the switch by increasing the impedance value to prevent current from substantially flowing thereinto when the voltage is low and decreasing the impedance value to allow current to flow thereinto when the voltage is high, thereby enabling power efficiency to be increased and waste of power to be prevented.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A semiconductor device with a protection circuit, the semiconductor device comprising:
    an output signal processing terminal, an input signal processing terminal, and a wireless output-input terminal;
    a signal detection unit connected to the wireless output-input terminal and configured to detect intensity of a signal transferred from the wireless output-input terminal toward the input signal processing terminal;
    a first switch connected to the signal detection unit and configured to operate on the basis of the intensity of the signal detected by the signal detection unit;
    a first resistive termination unit and a signal connection line each connected to the first switch so that the signal is able to be transferred by operation of the first switch, and disposed logically in parallel with each other, whereby the signal is able to be alternatively transferred to either one thereof, and
    a controller configured to control the first switch on the basis of the intensity of the signal detected by the signal detection unit,
    wherein the controller operates the first switch so that the signal is transferred to the signal connection line when the intensity of the signal detected by the signal detection unit is within a preset value and operates the first switch so that the signal is transferred to the first resistive termination unit when the intensity of the signal detected by the signal detection unit exceeds the preset value.

2. The semiconductor device of claim 1, further comprising:
    a second switch connected to an end opposite to the one end of the signal connection line to which the first switch is connected,
    wherein the controller, when outputting or inputting the signal, controls the first switch so that the signal is transferred through the signal connection line, and
    when outputting the signal, operates the second switch so that the signal is able to be output by allowing the output signal processing terminal and the signal connection line to be connected, and
    when inputting the signal, operates the second switch so that the signal is able to be output by allowing the input signal processing terminal and the signal connection line to be connected.

3. The semiconductor device of claim 2, further comprising:
    a second resistive termination unit disposed logically in parallel with the output signal processing terminal and the input signal processing terminal, thereby being configured to be able to be electrically connected to the signal connection line by the second switch,
    wherein the controller operates the second switch so that the signal is transferred to the input signal processing terminal when the intensity of the signal detected by the signal detection unit is within a preset value and operates the second switch so that the signal is transferred to the second resistive terminal unit when the intensity of the signal detected by the signal detection unit exceeds the preset value.

4. The semiconductor device of claim 1, further comprising:
    an electrical branch point provided between the first switch and the signal detection unit; and
    a switch protection unit disposed in parallel with the first switch so that the signal is able to be output thereto by being separated at the branch point,
    wherein the signal to be transferred from the signal detection unit to the first switch is branched off at the branch point and input to the switch protection unit, and the switch protection unit is configured to provide an impedance value that varies depending on the intensity of the input signal, whereby the intensity of the signal transferred to the first switch is adjusted.

5. The semiconductor device of claim 4, wherein the switch protection unit comprises:
    a corresponding voltage generator configured to receive the intensity of the signal detected by the signal detection unit and to generate a corresponding voltage corresponding to the intensity of the signal; and
    an impedance-varying unit configured to provide an impedance value that varies depending on the corresponding voltage.

6. The semiconductor device of claim 5, wherein the impedance-varying unit comprises:
    at least one transistor having one end connected to the branch point; and
    an impedance element connected between the at least one transistor and grounding,
    wherein the at least one transistor has an impedance value that varies depending on the corresponding voltage.

7. The semiconductor device of claim 6, wherein the impedance-varying unit further comprises:
    a voltage limiter connected between the branch point and the at least one transistor.

* * * * *